United States Patent [19]

Ueda et al.

[11] Patent Number: 5,385,867
[45] Date of Patent: Jan. 31, 1995

[54] METHOD FOR FORMING A MULTI-LAYER METALLIC WIRING STRUCTURE

[75] Inventors: Tetsuya Ueda; Kousaku Yano; Tomoyasu Murakami; Michinari Yamanaka; Shuji Hirao, all of Osaka; Noboru Nomura, Kyoto, all of Japan

[73] Assignee: Matsushita Electric Industrial Co., Ltd., Kadoma, Japan

[21] Appl. No.: 216,968

[22] Filed: Mar. 24, 1994

[30] Foreign Application Priority Data

Mar. 26, 1993 [JP] Japan ................. 5-068541

[51] Int. Cl.⁶ ............ H01L 21/283; H01L 21/31
[52] U.S. Cl. .................... 437/195; 437/189; 437/192; 437/194; 437/228; 437/229
[58] Field of Search ............. 437/189, 192, 194, 195, 437/228, 229; 156/659.1, 660

[56] References Cited

U.S. PATENT DOCUMENTS

| | | | |
|---|---|---|---|
| 4,536,951 | 8/1985 | Rhodes et al. | 437/190 |
| 4,614,021 | 9/1986 | Hulseweh | 437/189 |
| 4,842,991 | 6/1989 | Brighton | 437/229 |
| 4,892,845 | 1/1990 | Bridges | 437/195 |
| 4,914,056 | 4/1990 | Okumura | 437/192 |
| 4,952,528 | 8/1990 | Abe et al. | 437/194 |
| 4,957,881 | 9/1990 | Crotti | 437/195 |
| 4,987,099 | 1/1991 | Flanner | 437/192 |
| 4,996,167 | 2/1991 | Chen | 437/40 |
| 5,006,484 | 4/1991 | Harada | 437/192 |
| 5,204,286 | 4/1993 | Doan | 437/195 |

FOREIGN PATENT DOCUMENTS 61-208851 9/1986 Japan .
63-79347 4/1988 Japan .
4-152526 5/1992 Japan .

Primary Examiner—T. N. Quach
Attorney, Agent, or Firm—Willian Brinks Hofer Gilson & Lione

[57] ABSTRACT

After accumulating a BPSG film layer on a silicon substrate, a first Al—Si—Cu film layer, a W film layer and a second Al—Si—Cu film layer are successively accumulated on this BPSG film layer. A resist pattern with wide-width and narrow-width pattern portions is formed on the second Al—Si—Cu film layer. The wide-width pattern portion is provided at a position corresponding to a contact for connecting a first-layer metallic wiring and a second-layer metallic wiring, while the narrow-width pattern portion is provided at a position corresponding to a wiring portion for the first-layer metallic wiring. After applying first etching on the second Al—Si—Cu film layer with a mask of the resist patter, second etching is applied on the W film layer. Thereafter, by applying third etching, the resist pattern remaining on the first-layer metallic wiring is removed and the first Al—Si—Cu film layer is transfigured into a tall metallic film portion and a short metallic film portion. After accumulating an inter-layer insulating film layer on the first Al—Si—Cu film layer, etchback is applied on this inter-layer insulating film layer until the top of the tall metallic film portion is bared. Then, the second-layer metallic wiring is formed on the inter-layer insulating film layer so that the second-layer metallic wiring is connected with the tall metallic film portion.

7 Claims, 20 Drawing Sheets

Fig.13

| | EMBODIMENT 2<br>AlSiCu/W<br>2-LAYER STRUCTURE | EMBODIMENT 3<br>AlSiCu/W/AlSiCu<br>3-LAYER STRUCTURE |
|---|---|---|
| CROSS SECTIONAL STRUCTURE | PILLAR AlSiCu / WIRING / W | PILLAR AlSiCu / WIRING / W / AlSiCu |
| SHEET RESISTANCE (500nm) | 182mΩ/□ | 60mΩ/□ |
| PILLAR RESISTANCE 0.5μm φ | 1.4Ω/PIECE | 0.66Ω/PIECE |
| MERIT | ALLOWING BLANKET W PLUGGING INTO CONTACT PORTION | LOWER RESISTANSE WIRING |

METHOD FOR FORMING A MULTI-LAYER METALLIC WIRING STRUCTURE

BACKGROUND OF THE INVENTION

1. Field of the Invention

The present invention relates to a method for forming a multi-layer metallic wiring structure, which is preferably used in the manufacturing process for semiconductor devices.

2. Prior Art

Recent, large scale, integrated semiconductor circuit devices have been so greatly minimized that very severe requirements are applied on reliability of an inter-layer metallic connection—i.e. through hole—between metallic wiring layers. To increase the reliability of a fined through hole, metal is generally plugged into the through hole by the use of the high-temperature aluminum sputter method or the blanket W-CVD method.

Hereinafter, one example of a conventional blanket W-CVD method will be explained with reference to drawings.

FIGS. 18A to 18C illustrate a manufacturing process of a semiconductor device whose multi-layer metallic wiring structure is formed by the conventional blanket W-CVD method.

As illustrated FIG. 18A, a first oxide film layer 2 (usually, a BPSG film layer) is accumulated on a silicon substrate 1. Then, first metallic wiring 3 is formed on the first oxide film layer 2 by the use of photolithography and dry etching.

Subsequently, as illustrated in FIG. 18B, a second oxide film layer 4 is accumulated on the first oxide film layer 2 and the first metallic wiring 3. After the upper surface of the second oxide film layer 4 is flattened by the resist etchback method or the CMP (Chemical Mechanical Polishing) method, a through hole 5 is opened by photolithography and dry etching. Thereafter, a Ti-series sputter film layer 6 and a W-CVD film layer 7 are accumulated, and the W-CVD film layer 7 is flattened by the etchback method until the second oxide film layer 4 is bared entirely. In this case, the etchback method can be replaced by the CMP method and also both the second oxide film layer 4 and the W-CVD film layer 7 can be flattened simultaneously.

Next, as illustrated in FIG. 18C, a metallic film layer is accumulated on the second oxide film layer 4. Then, this metallic film layer is etched to form second metallic wiring 8, thereby accomplishing the formation of a two-layer metallic wiring structure.

Such a method of filling up the through hole 5 with metallic material for providing a conductive path between two metallic wiring brings merits of:

(1) increasing the reliability of a through hole remarkably;
(2) forming the conductive path with better efficiency even if the through hole diameter is very small (i.e. a high aspect ratio through hole); and
(3) flattening the metallic film above the through hole.

However, above-described conventional method is disadvantageous in that at least three masks are required for formation of the two-layer metallic wiring structure comprising the first metallic wiring, the through hole and the second metallic wiring.

Furthermore, in the case where the blanket W-CVD plugging method is adopted, it will encounter with other problems, such that costs for film accumulations by sputtering, CVD deposition and etchback will increase the overall cost of the wiring process greatly.

Moreover, at least two alignments—one for the first metallic wiring and the through hole, and the other for the through hole and the second metallic wiring—are required in the photolithography. This will result in a problem that alignment deviation arises easily.

SUMMARY OF THE INVENTION

Accordingly, in view of above-described problems encountered in the prior art, an object of the present invention is to provide a method for forming a multi-layer metallic wiring structure capable of not only reducing the number of masks to be used, for example, from three to two for a two-layer metallic wiring structure but forming a through hole by self alignment.

FIG. 1 is a process flow showing the difference between the conventional art and the present invention. As apparent from this process flow, the present invention is characterized by having no process relating to a through hole, such as lithography of the through hole, etching of the through hole, and plugging of a metallic material into the through hole.

In short, the present invention, in order to change the conventional three-mask construction of the two-layer metallic wiring structure to a novel two-mask construction, stores information relating to a mask for a through hole into either the information for a first-layer metallic wiring or the information for a second-layer metallic wiring as illustrated in FIGS. 2A and 2B. Namely, according to first to third methods of the present invention, the through hole information is involved in the information for the first-layer metallic wiring. Meanwhile, according to fourth and fifth methods of the present invention, the through hole information is involved in the information for the second-layer metallic wiring.

For the former case, as the first-layer metallic wiring mask includes two, wiring portion and through hole, information, it is necessary to discriminate these two information. For this discrimination, as illustrated in FIG. 2C, a region corresponding to the through hole is designed to have a width W wider than a predetermined value $\Psi$ and a region corresponding to the wiring portion is designed to have a width w narrower than the predetermined value $\Psi$. Hereinafter, a method for forming a multi-layer metallic wiring structure in accordance with the present invention will be explained in detail.

In order to accomplish above purposes, a first aspect of the present invention provides a method for forming a multi-layer metallic wiring structure comprising steps of: accumulating a metallic film layer on a first insulating film layer formed on a semiconductor substrate: forming a resist pattern with wide-width and narrow-width pattern portions on said metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring; patterning said metallic film layer by applying etching on said metallic film layer with a mask of said resist pattern; applying etching on said resist pattern and said metallic film layer to remove said resist pattern and form both tall and short metallic film portions made of said metallic film layer, said tall metallic film portion being formed beneath said wide-width pattern portion of said resist pattern and said short metallic film portion being provided beneath said narrow-width pattern portion of said resist pattern; accumulating a second insulating film layer, qualifying as an inter-layer insulating film layer, on said metallic film layer; flattening said inter-layer insulating film layer so as to bare said tall metallic film portion without baring said short metallic film portion; and forming said second-layer metallic wiring on said second insulating film layer, so that said second-layer metallic wiring is connected with said tall metallic film portion.

A second aspect of the present invention provides a method for forming a multi-layer metallic wiring structure comprising steps of: forming a first metallic film layer on a first insulating film layer formed on a semiconductor substrate; forming a second metallic film layer on said first metallic film layer, said second metallic film layer being made of material different From that of said first metallic film layer; forming a resist pattern with wide-width and narrow-width pattern portions on said second metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring; patterning said second metallic film layer by applying etching on said second metallic film layer with a mask of said resist pattern; applying etching on said first metallic film layer with masks of said resist pattern and said second metallic film layer, so as to leave only said wide-width pattern portion of said resist pattern and pattern said first metallic film layer; applying etching on said second metallic film layer with a mask of said wide-width pattern portion of said resist pattern, so as to form a contact beneath said wide-width pattern portion by only leaving said second metallic film layer in the region of said wide-width pattern portion of said resist pattern; accumulating a second insulating film layer, qualifying as an inter-layer insulating film layer, on said contact and said first metallic film layer; etching said second insulating film layer to bare said contact; and forming said second-layer metallic wiring on said second insulating film layer, so that said second-layer metallic wiring is connected with said contact.

A third aspect of the present invention provides a method for forming a multi-layer metallic wiring structure comprising steps of: forming a first metallic film layer on a first insulating film layer formed on a semiconductor substrate; forming a second metallic film layer on said first metallic film layer, said second metallic film layer being made of material different from that of said first metallic film layer; forming a third metallic film layer on said second metallic film layer, said third metallic film layer being made of material different from that of said second metallic film layer; forming a resist pattern with wide-width and narrow-width pattern portions on said third metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring; patterning said third metallic film layer by applying first etching on said third metallic film layer with a mask of said resist pattern and, subsequently, patterning said second metallic film layer by applying second etching on said second metallic film layer with a mask of said patterned third metallic layer, thereby leaving only said wide-width pattern portion of said resist pattern through said first and second etchings; applying etching on said third metallic film layer with a mask of said wide-width pattern portion of said resist pattern, so as to form a contact beneath said wide-width pattern portion by only leaving said third metallic film layer in the region of said wide-width pattern portion of said resist pattern; accumulating a second insulating film layer, qualifying as an inter-layer insulating film layer, on said contact and said second metallic film layer; etching said second insulating film layer to bare said contact; and forming said second-layer metallic wiring on said second insulating film layer, so that said second-layer metallic wiring is connected with said contact.

In this third aspect of the present invention, it is preferable that said first metallic film layer and said third metallic film layer are made of the same material. Furthermore, in this case, it is preferable that said first metallic film layer and said third metallic film layer are made of metal containing aluminum, while said second metallic film layer is made of metal containing tungsten.

A fourth aspect of the present invention provides a method for forming a multi-layer metallic wiring structure comprising steps of: forming a first-layer metallic wiring on a first insulating film layer formed on a semiconductor substrate; forming a flattened, second insulating film layer, qualifying as an inter-layer insulating film layer, on said first-layer metallic wiring; forming a resist pattern with wide-width and narrow-width openings on said second insulating film layer, said wide-width opening being provided at a position corresponding to a contact for connecting said first-layer metallic wiring and a second-layer metallic wiring and said narrow-width opening being provided at a position corresponding to a wiring portion for said second-layer metallic wiring; applying etching on said second insulating film layer with a mask of said resist pattern, in such a manner that a shallow groove is formed on said second insulating film layer beneath said narrow-width opening without baring said first-layer metallic wiring while a deep hole is formed on said second insulating film layer beneath said wide-width opening so as to bare said first-layer metallic wiring; forming a metallic film layer on said second insulating film layer, so that said metallic film layer is connected with said first-layer metallic wiring in said wide-width opening of said resist pattern; and applying etchback on entire surfaces of said second insulating film layer and said metallic film layer to form said wiring portion of said second-layer metallic wiring in said shallow groove and said contact in said deep hole.

A fifth aspect of the present invention provides a method for forming a multi-layer metallic wiring structure comprising steps of: forming a first-layer metallic wiring on a first insulating film layer formed on a semiconductor substrate; forming a flattened, second insulating film layer, qualifying as an inter-layer insulating film layer, on said first-layer metallic wiring; forming wide-width and narrow-width openings on said second insulating film layer respectively having a depth not reaching said first-layer metallic wiring, said wide-width opening being provided at a position corresponding to a contact for connecting said first-layer metallic wiring and a second-layer metallic wiring and said narrow-width opening being provided at a position corresponding to a wiring portion for said second-layer metallic wiring; forming a first metallic film layer on said second insulating film layer; applying etchback on entire surface of said first metallic film layer to bare said second insulating film layer; baring said first-layer metallic wiring by etching said second insulating film layer in the region beneath said wide-width opening; forming a second metallic film layer on said second insulating film layer so that said second metallic film layer is connected to said first-layer metallic wiring; and applying etchback on entire surface of said second metallic film layer until said second insulating film layer is bared, thereby forming said second-layer metallic wiring made of said second metallic film layer.

In accordance with above first to fifth aspects of the present invention, the following effects are enjoyed:

(1) Since the mask information for a through hole is involved in either the mask pattern for the first-layer metallic wiring or the mask pattern for the second-layer metallic wiring, the number of photo masks required in the forming process of a two-layer metallic wiring structure can be reduced, for example, from three to two;

(2) Etching process conventionally required for forming a through hole can be omitted;

(3) As the fourth and fifth aspects of the present invention inherently provide plugging-type wiring, flatness of the second-layer metallic wiring is improved;

(4) Possibility of mask deviation in the photolithography can be reduced, for example, from two to one;

(5) As the through hole is filled with metal serving as a contact, reliability of the wiring can be improved at the region of this contact; and (6) Reliability of the contact is improved since the largeness of the through hole is kept constant.

BRIEF DESCRIPTION OF THE DRAWINGS

The above and other objects, features and advantages of the present invention will become more apparent from the following detailed description which is to be read in conjunction with the accompanying drawings, in which:

FIG. 13 is a table comparing the second and third embodiments;

DETAILED DESCRIPTION OF THE PREFERRED EMBODIMENTS

Hereinafter, preferred embodiments of the present invention will be explained in detail with reference to the accompanying drawings.

First embodiment

The first embodiment of the present invention will be explained with reference to FIGS. 3A to 3H.

Figure 1:
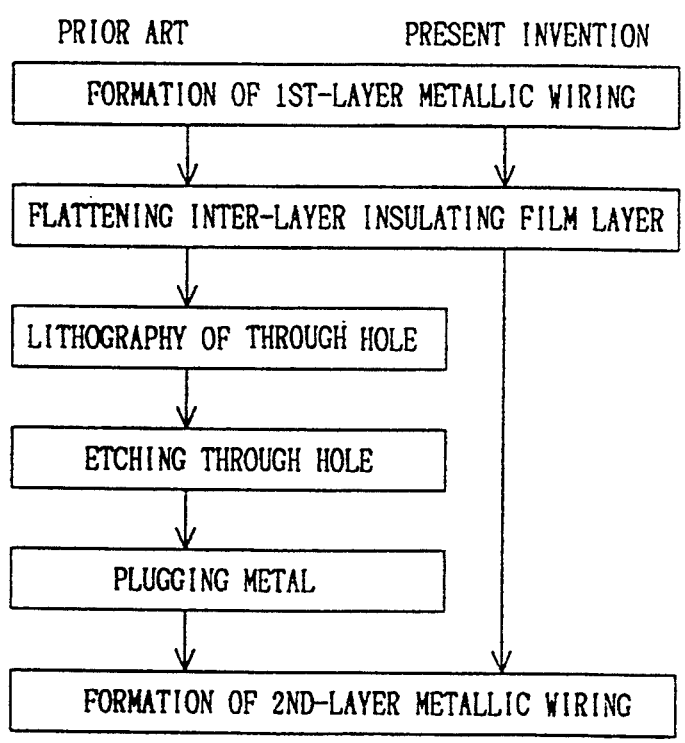
FIG. 1 is a flowchart showing comparison between the conventional method and the present invention method.
Figure 2A:
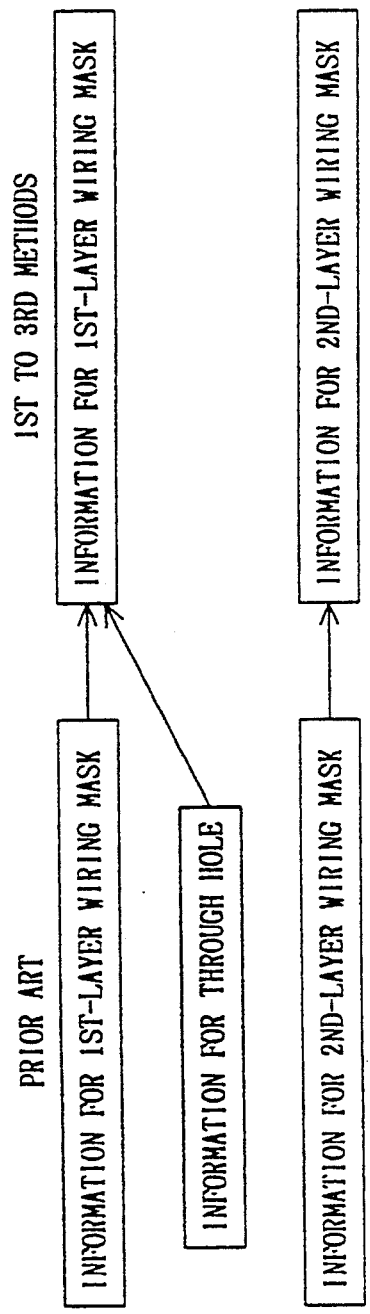
FIG. 2A is a view showing mask information in accordance with first to third embodiments of the present invention in comparison with the conventional method.
Figure 2B:
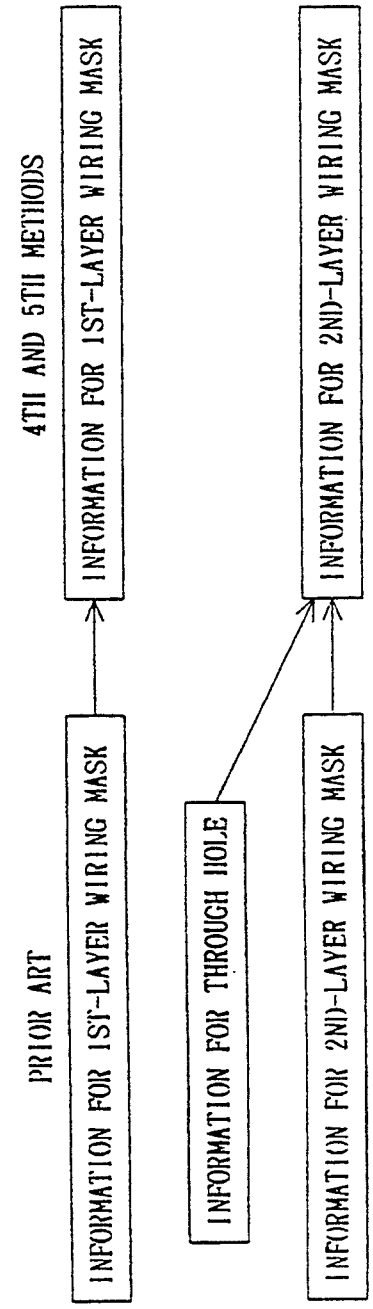
FIG. 2B is a view showing mask information in accordance with fourth and fifth embodiments of the present invention in comparison with the conventional method.
Figure 3A:
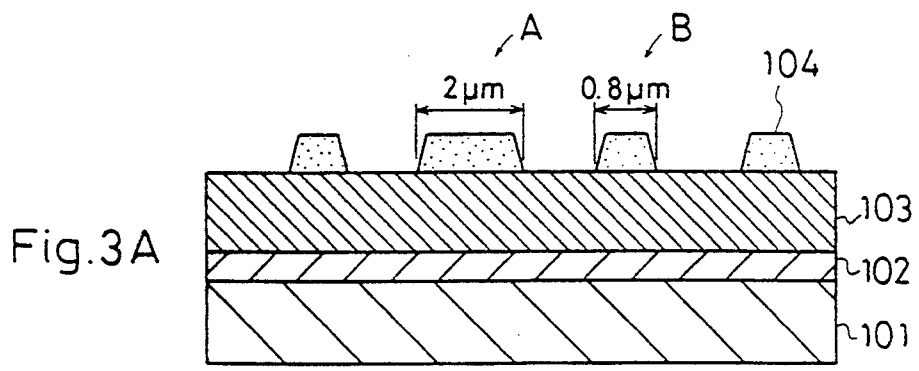
FIGS. 3A to 3H are cross-sectional views of a semiconductor device, illustrating a process for forming a multi-layer metallic wiring structure in accordance with the first embodiment of the present invention.

As illustrated in FIG. 3A, a BPSG film layer 102 with a film thickness of 700 nm, qualifying as a first insulating film layer, is accumulated on a silicon substrate 101 associated beforehand with active devices (not shown), such as transistors. A first Al—Si—Cu film layer 103 with a film thickness of 1200 nm is accumulated on this BPSG film layer 102. Then, a resist pattern 104 is formed on the first Al—Si—Cu film layer 103 using the photolithography method. This resist pattern 104 has a wide-width pattern portion (2 μm) serving as a contact region A where a first-layer metallic wiring and a second-layer metallic wiring are electrically connected with each other and a narrow-width pattern portion (0.8 μm) serving as a wiring region B where the first-layer metallic wiring is arranged.

Figure 3B:
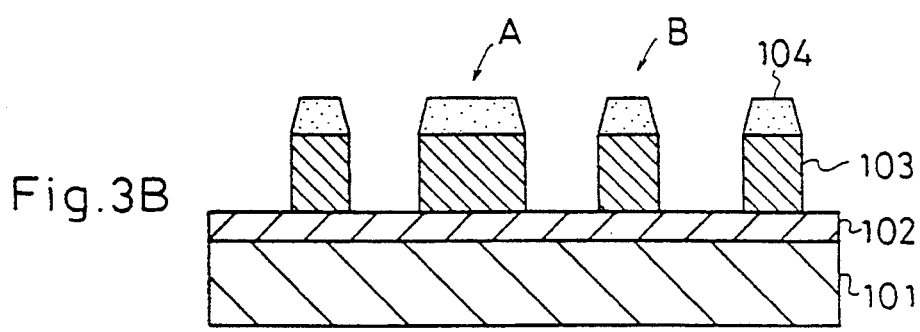

Next, as illustrated in FIG. 3B, dry etching is applied on the first Al—Si—Cu film layer 103 with a mask of the resist pattern 104, to pattern the first Al—Si—Cu film layer 103.

Figure 3C:
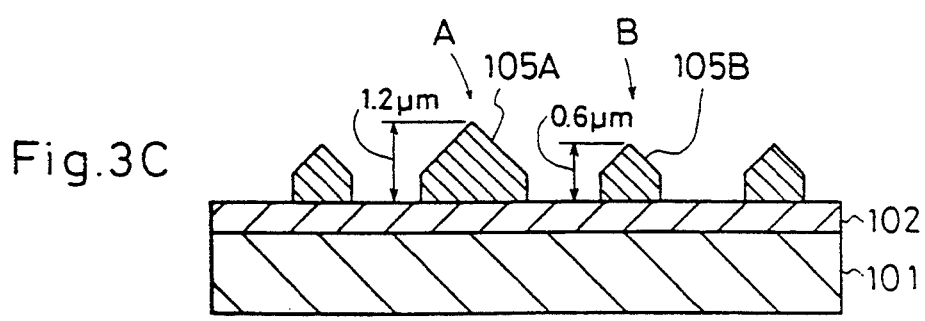

Thus patterned, first Al—Si—Cu film layer 103 accompanied by the resist pattern 104 remaining thereon is then applied the sputter etching using gas mixture of Cl and Ar which have capability of strongly sputtering the first Al—Si—Cu film layer 103, until the resist pattern 104 is completely removed and the corners of the first Al—Si—Cu film layer 103 are etched inclinedly as shown in FIG. 3C. More specifically, as the sputter etching generally has a large etching rate in a 45° inclined direction, the flat top portion of the first Al—Si—Cu film layer 103 is cut off obliquely at corners, like a gable roof. In this case, a tall metallic wiring potion 105A (height: 1.2 μm) is formed at the contact region A corresponding to the wide-width pattern portion of the resist pattern 104. On the contrary, a short metallic wiring potion 105B (height: 0.6 μm) is formed at the wiring region B corresponding to the narrow-width pattern portion of the resist pattern 104.

A threshold value for discriminating the tall metallic wiring portion 105A and the short metallic wiring portion 105B can be changed based on process conditions. The present invention sets the widths of the wide-width and narrow-width pattern portions of the resist pattern 104 to be 2 μm and 0.8 μm, respectively, thereby obtaining the tall metallic wiring portion 105A of 1.2 μm height and the short metallic wiring portion 105B of 0.6 μm height.

Figure 3D:
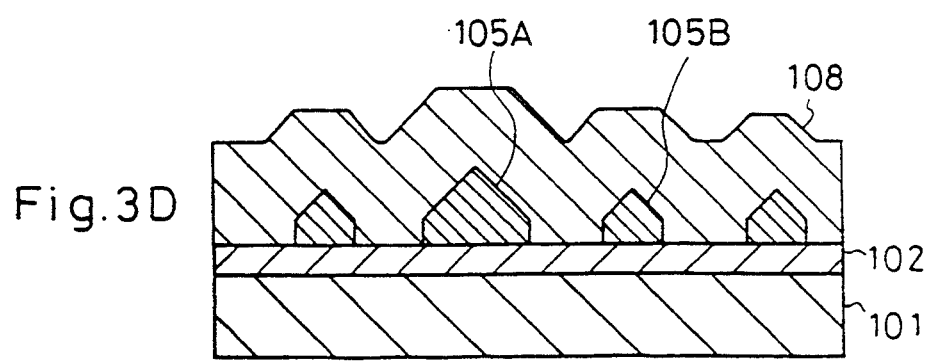

In turn, as illustrated in FIG. 3D, an inter-layer insulating film layer 108 with a film thickness of approximately 2 μm, qualifying as a second insulating film layer, is accumulated on both the metallic wiring portions 105a and 105b. A plasma oxide film made of TEOS material or an atmospheric pressure CVD oxide film made of ozone-TEOS material is preferably used as this inter-layer insulating film layer 108.

Figure 3E:
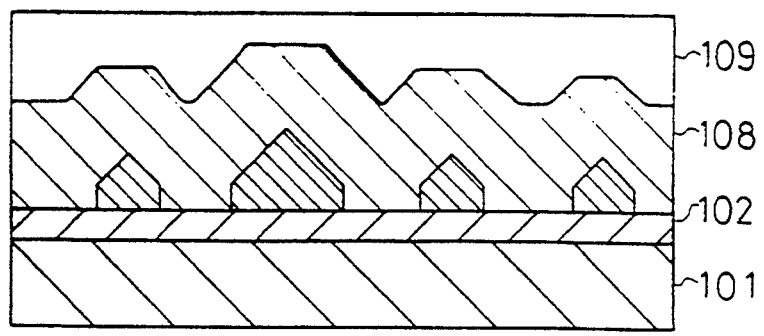

Thereafter, as illustrated in FIG. 3E, a flattening resist 109 is coated by the spin-coater method and accumulated on the inter-layer insulating film 108 as a victimized film layer for flattening the inter-layer insulating film layer 108.

Figure 3F:
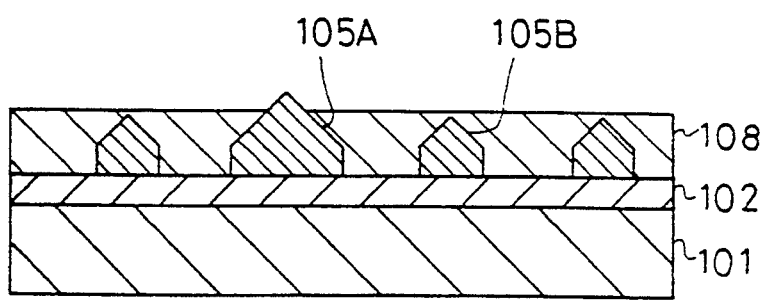

Subsequently, as illustrated in FIG. 3F, using $CHF_3$—$CF_4$—$O_2$ series dry etching having an etching rate of 1:1 to the resist and the oxide film, etchback is carried out until the top of the tall metallic wiring portion 105A is just bared. The similar result would be obtained even if the CMP (Chemical Mechanical Polishing) is used instead of the etchback.

Figure 3G:
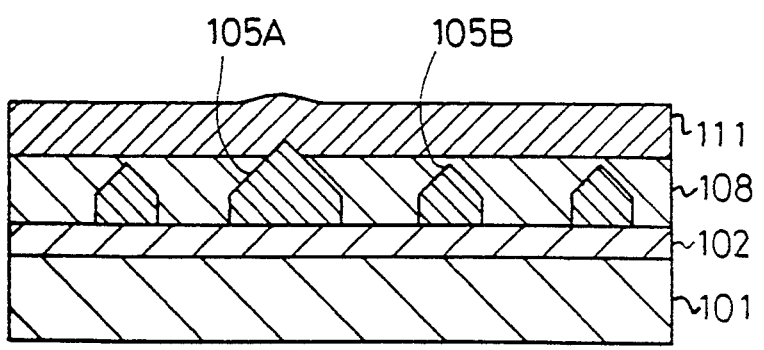
Figure 3H:
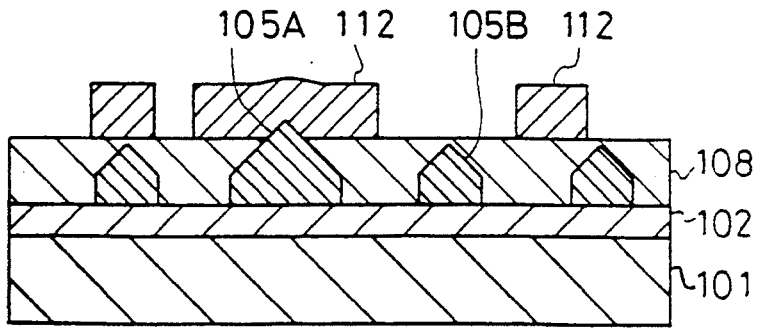

Then, as illustrated in FIG. 3G, a second Al—Si—Cu film layer 111 with a film thickness of 700 nm is accumulated on the inter-layer insulating film layer 108 by the sputter method. Finally, as shown in FIG. 3H, a second-layer metallic wiring 112 is formed by applying the photolithography and dry etching on the second Al—Si—Cu film layer 111.

A two-layer metallic wiring structure using only two masks is realized in this manner. The above-described, first embodiment of the present invention is characterized in that the resist pattern 104 forming the first-layer metallic wiring is designed in such a manner that the contact region A and the wiring region B are discriminated from each other by changing the size (e.g. width) of the resist pattern 104. In addition, by controlling the area of the tall metallic wiring portion 105A to be bared for the connection with the second-layer metallic wiring 112, the rule of the second-layer metallic wiring 112 is finely determined.

In accordance with the first embodiment of the present invention, a mask and an etching for forming a through hole can be both omitted. Furthermore, a plugging-type through hole can be realized without using the blanket W-CVD plugging method, thus realizing cost reduction of fabrication processes.

Second embodiment

The second embodiment of the present invention will be explained with reference to FIGS. 4A to 4G.

Figure 4A:
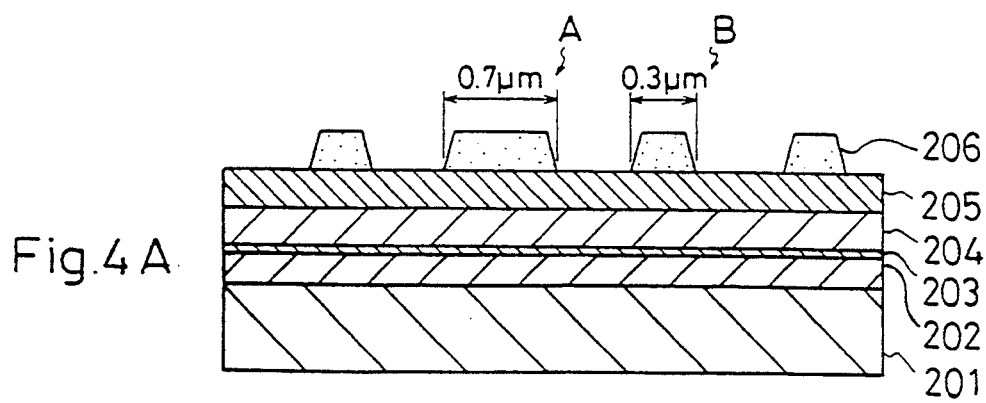
FIGS. 4A to 4G are cross-sectional views of a semiconductor device, illustrating a process for forming a multi-layer metallic wiring structure in accordance with the second embodiment of the present invention.

As illustrated in FIG. 4A, a BPSG film layer 202 with a film thickness of 700 nm, qualifying as a first insulating film layer, is accumulated on a silicon substrate 201 associated beforehand with active devices (not shown), such as transistors. A TiN/Ti lamination film layer 203, qualifying as an adhesion layer, is accumulated on the BPSG film layer 202 by the sputter method. Then, a W film layer 204 with a film thickness of 400 nm is accumulated on this TiN/Ti lamination film layer 203 by the CVD method or the sputter method. Thereafter, a first Al—Si—Cu film layer 205 with a film thickness of 1000 to 1500 nm is accumulated on this W film layer 204.

Then, a resist pattern 206 for forming a first-layer metallic wiring is formed on the first Al—Si—Cu film layer 205 using the photolithography method. This resist pattern 206 has a wide-width pattern portion serving as a contact region A where the first-layer metallic wiring and second-layer metallic wiring are electrically connected with each other and a narrow-width pattern portion serving as a wiring region B where the first metallic wiring is arranged. In this second embodiment, the wide-width pattern portion is formed into a square having a side of 0.7 μm. And, the narrow-width pattern portion has a width of 0.3 μm.

Figure 4B:
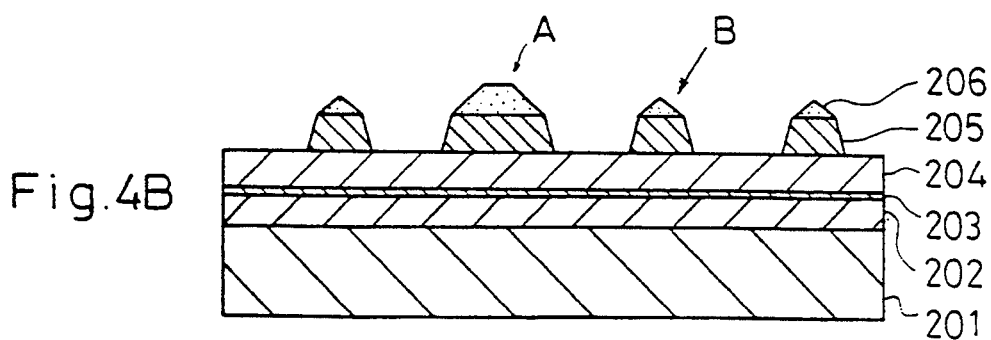

Next, an etching is applied on this first Al—Si—Cu film layer 205 using Cl series gas, such as $N_2$/ $BCl_3$/$CHCl_3$/ $Cl_2$. As this etching has capability of strong sputtering, the wide-width pattern portion of the resist pattern 206 is formed into a tapered shape and the narrow-width pattern portion is slightly left as shown in FIG. 4B.

Figure 4C:
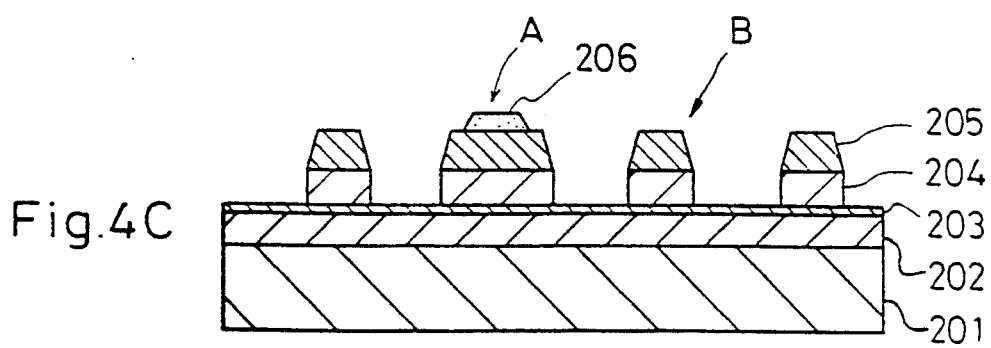

Next, using the resist pattern 206 as a mask, the W film layer 204 is etched by F series gas, such as $SF_6$. Hence, as illustrated in FIG. 4C, the wide-width pattern portion of the resist pattern 206 remains at the central portion of the Al—Si—Cu film layer 205, while the narrow-width pattern portion of the resist pattern 206 disappears completely.

Figure 4D:
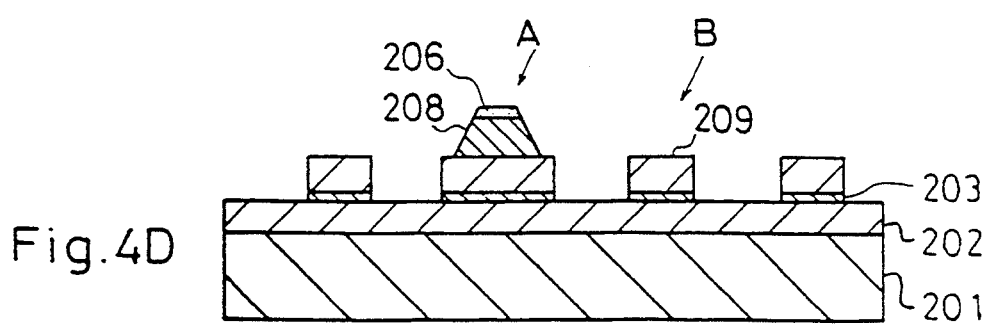

Subsequently, the first Al—Si—Cu film layer 205 is etched by Cl series gas to form a first-layer metallic wiring 209, which is originally the W film layer 204, as shown in FIG. 4D. Since only the wide-width pattern portion of the resist pattern 206 remains in the state of FIG. 4C, the first Al—Si—Cu film layer 205 changes into a contact 208 at the portion corresponding to this wide-width pattern portion while another portions of the first Al—Si—Cu film layer 205 disappears completely. The W film layer 204 functions as an etching stopper.

Figure 4E:
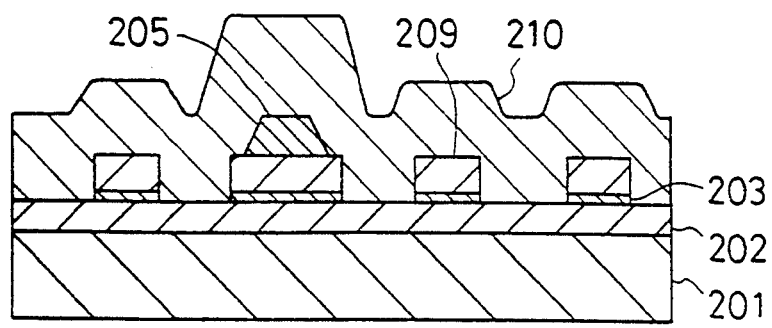

After removing the resist left on the contact 208 completely by ashing and cleaning, a plasma oxide film layer 210 with a film thickness of 2 μm, qualifying as an inter-layer insulating film layer, is accumulated on the W film layer 204 as shown in FIG. 4E.

Figure 4F:
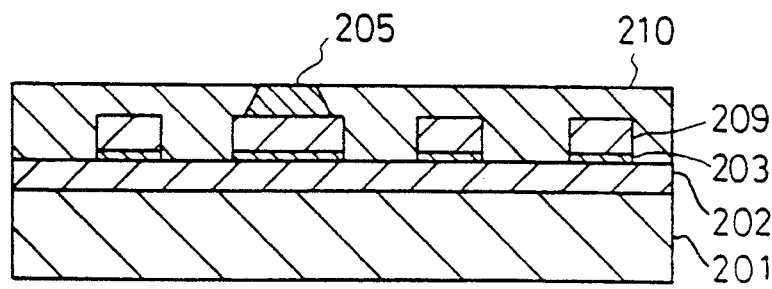

In turn, as illustrated in FIG. 4F, the plasma insulating film layer 210 is flattened by the resist etchback method or the CMP method. In this case, the film thickness of the plasma insulating film layer 210 to be removed needs to be carefully controlled so that the upper surface of the contact 208 is just bared.

Figure 4G:
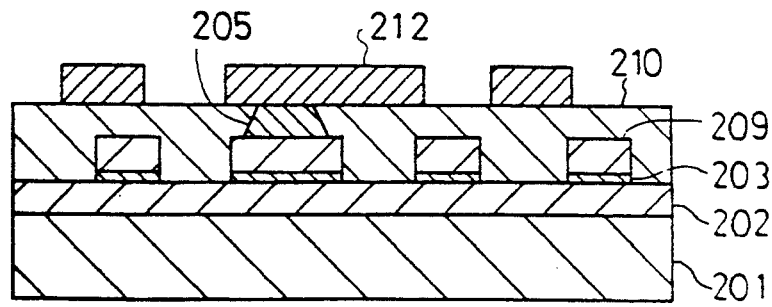

Next, as illustrated in FIG. 4G, after a second Al—Si—Cu film layer is accumulated on the plasma insulating film layer 210 by the sputtering method, this second Al—Si—Cu film layer is etched by photolithography and dry etching and is formed into a second-layer metallic wiring 212 made of the second Al—Si—Cu film layer.

In this second embodiment, the two-layer metallic wiring structure, comprising the first- and second-layer metallic wiring 209,212 and the contact 208 intervening therebetween, had a connecting resistance of approximately 2 ohm and showed linear current-voltage characteristics.

Regarding insulation ability between the first-layer metallic wiring 209 and the second-layer metallic wiring 212 in the region other than the contact 208, a leak current equal to or less than 100 pA/mm$^2$, which is allowable in view of electric characteristics, was detected.

According to this second embodiment, in addition to the effect of the first embodiment, controllability of forming the wiring structure is improved since the first-layer metallic wiring 209 acts as an etching stopper when the contact 205 is formed.

By the way, the similar effect would be obtained even if the first-layer metallic wiring 209 is made of Al series metal and the second-layer metallic wiring 212 is made of W series metal instead of the above-described materials.

Third embodiment

The third embodiment of the present invention will be explained with reference to FIGS. 5A to 5H.

Figure 5A:
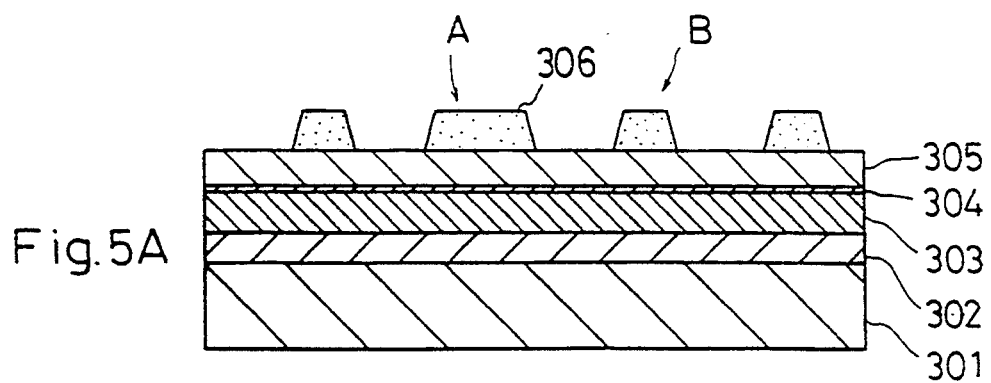
FIGS. 5A to 5H are cross-sectional views of a semiconductor device, illustrating a process for forming a multi-layer metallic wiring structure in accordance with the third embodiment of the present invention.

As illustrated in FIG. 5A, a BPSG film layer 302 with a film thickness of 700 nm, qualifying as a first insulating film layer, is accumulated on a silicon substrate 301 associated beforehand with active devices, such as transistors. A first Al—Si—Cu film layer 303 containing a barrier metal layer (AlSiCu/TiN/Ti, film thickness: 500/100/25 nm) qualifying as a first metallic film layer, a W film layer 304 (film thickness: 100 nm) qualifying as a second metallic film layer, and a second Al—Si—Cu film layer 305 (TiN/AlSiCu, film thickness: 30/1000 nm) qualifying as a third metallic film layer are successively accumulated on the BPSG film layer 302. Thereafter, a resist pattern 306 is formed using the photolithography method. This resist pattern 306, as well as the first and second embodiments, comprises a wide-width pattern portion serving as a contact region A for connecting the first- and second-layer metallic wiring and a narrow-width pattern portion serving as a wiring region B for arranging the first-layer metallic wiring.

Figure 5B:
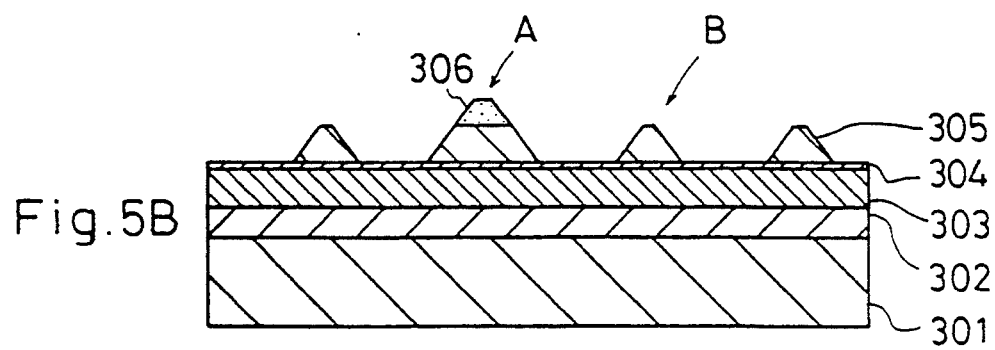

Next, with a mask of the resist pattern 306, a first etching using Cl series gas is applied on the second Al—Si—Cu film layer 305, so as to form a second Al—Si—Cu film layer 305 formed into a predetermined pattern as shown in FIG. 5B. This first etching has so strong etching capability that the narrow-width pattern portion of the resist pattern 306 is completely removed, although the wide-width pattern portion of the resist pattern 306 remains at the center of the second Al—Si—Cu film layer 305. Conditions for this first etching is as follows:

N$_2$/BCl$_3$/CHCl$_3$/Cl$_2$=40/10/2/8 sccm;
Pressure=125 mTorr;
RF electric power =250 W; and
Susceptor temperature=90 ° C.

Figure 5C:
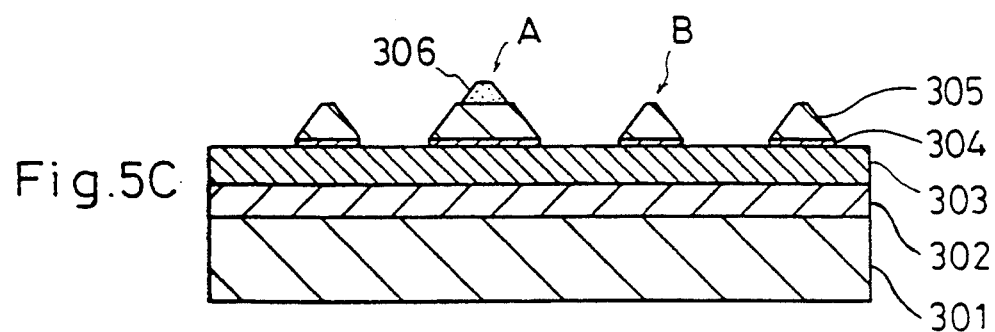

Subsequently, with thus patterned, second Al—Si—Cu film layer 305, a second etching using F series gas is applied on the W film layer 304 so as to form a patterned W film layer 304 as shown in FIG. 5C.

Conditions for this second etching is as follows:

SF$_6$=50 sccm;
Pressure=80 mTorr;
RF electric power=156 W; and
Susceptor temperature=10 ° C.

Figure 5D:
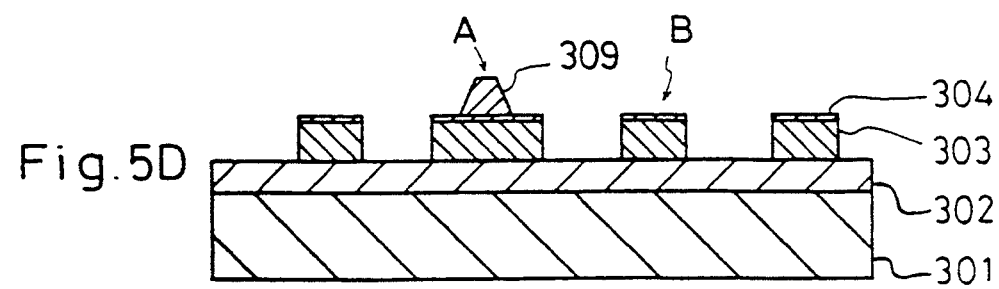

In turn, with a mask of thus patterned W film layer 304, a third etching using Cl series gas is applied on the first Al—Si—Cu film layer 303 so as to form a patterned, first Al—Si—Cu film layer 303 serving as the first-layer metallic wiring as shown in FIG. 5D. As a result of this third etching which makes the W film layer 304 act as an etching stopper, the second Al—Si—Cu film layer 305 disappears in the wiring region B for the first-layer metallic wiring while the second Al—Si—Cu film layer 305 remains as a contact 309 in the contact region A. Thereafter, the remaining resist pattern 306 is removed from the top of the contact 309 by the oxygen ashing.

A threshold value for discriminating the wide-width pattern portion and the narrow-width pattern portion of the resist pattern 306 can be varied based on process conditions. This third embodiment sets the wide-width and narrow-width pattern portions of the resist pattern 306 to be 0.7 μm and 0.3 μm, respectively.

Although the narrow-width pattern portion of the resist pattern 306 is removed by the above-described first etching, this third embodiment will allow to utilize the second etching for removing this resist pattern 306. Otherwise, an oxygen etching would be added after the second etching to remove the narrow-width pattern portion of the resist pattern 306.

Figure 5E:
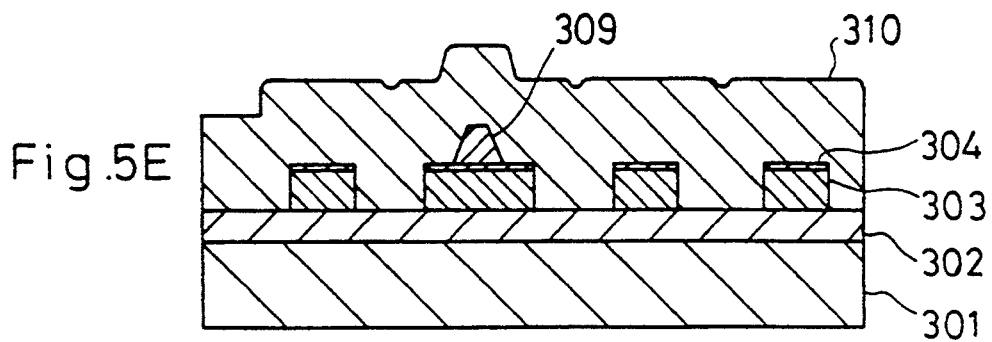

Next, as illustrated in FIG. 5E, an inter-layer insulating film layer 310 with a film thickness of approximately 2 μm, qualifying as a second insulating film layer, is accumulated on the W film layer 304. This third embodiment adopts TEOS material for the inter-layer insulating film layer 310. However, a plasma oxide film or an ozone-TEOS, atmospheric pressure CVD, oxide film can be equivalently used for the inter-layer insulating film layer 310.

Figure 5F:
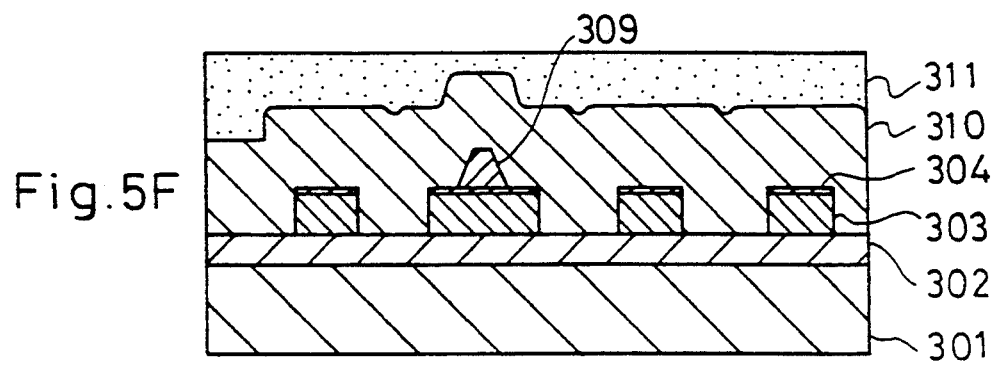

Then, as illustrated in FIG. 5F, to flatten the inter-layer insulating film layer 310, a flattening resist 311 serving as a victimized film layer is coated on this inter-layer insulating film layer 310 using the spin coater method.

Figure 5G:
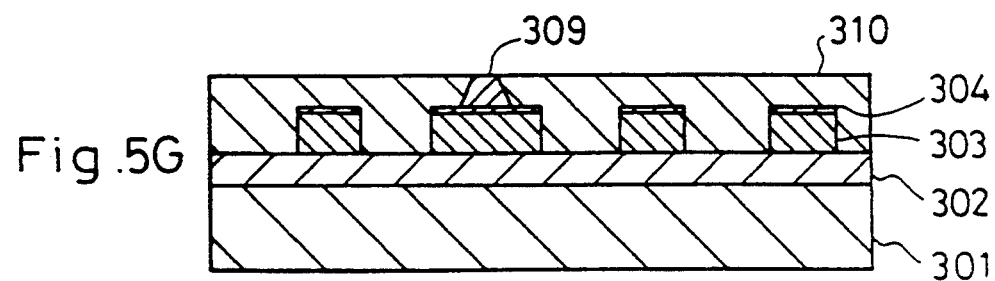
Figure 5H:
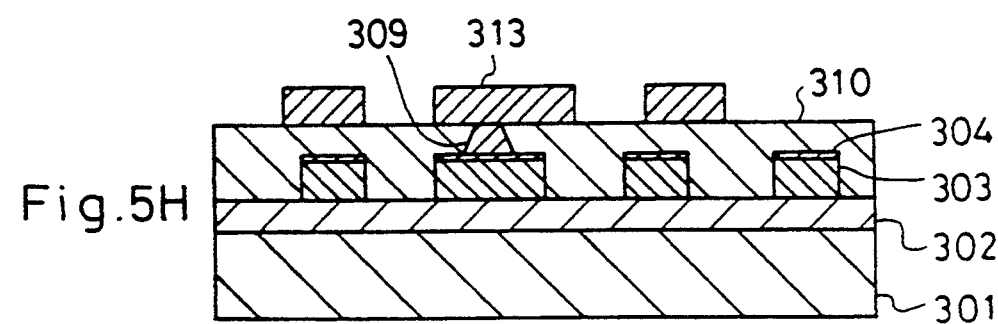

After that, as illustrated in FIG. 5G, using CHF$_3$—CF$_3$—O$_2$ series dry etching with an etching rate of 1:1 to the flattening resist 311 and the inter-layer insulating film layer 310, etchback is carried out until the top of the contact 309 is just bared, thus flattening the upper surface of the inter-layer insulating film layer 310. The similar result would be obtained even if the CMP (Chemical Mechanical Polishing) is used instead of the etchback. Then, as illustrated in FIG. 5H, a third Al—Si—Cu film layer 312 with a film thickness of 800 nm serving as a second-layer metallic wiring is accumulated on the flattened inter-layer insulating film layer 310 by the sputter method. Then, photolithography and dry etching are applied on this third Al—Si—Cu film layer 312 to form a second-layer metallic wiring 313, thereby accomplishing the formation of a two-layer metallic wiring structure.

The above-described, third embodiment of the present invention is characterized as well as the first and second embodiments in that the design of the mask for the first-layer metallic wiring includes information about the wiring region and the contact region. Under the same basic principle as the first embodiment, this third embodiment utilizes the W film layer 304 intervened between metallic film layers as an etching stopper. Thus, controllability of the wiring region and the contact region can be improved. Also, electrical leaking characteristics between the first- and second-layer metallic wiring can be improved.

This third embodiment is superior to the second embodiment by having a low electric resistance value since the first-layer metallic wiring is made of Al—Si—Cu material.

Hereinafter, experimental results of the above-described third embodiment will be explained.

Figure 6:
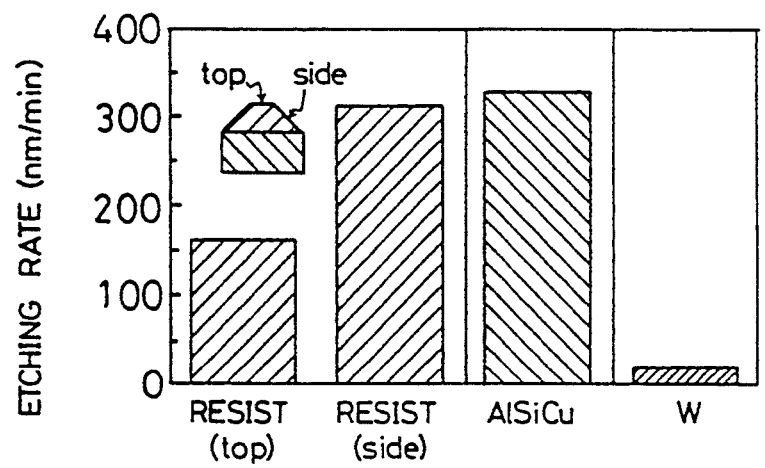
FIG. 6 is a graph showing etching rates of an etching gas used in the first etching of the third embodiment with respect to various materials.

FIG. 6 is a graph showing etching rates of the etching gas, used in the first etching explained with reference to FIG. 5B, with respect to various materials. From this graph, it is understood that the W film layer sufficiently functions as an etching stopper since Al—Si—Cu has higher selectivity against the W film, and that etching is promoted from the side of a resist since the etching rate is higher at the side than at the top of the resist, and therefore, the resist disappears earlier at the narrow-width pattern portion.

Figure 7:
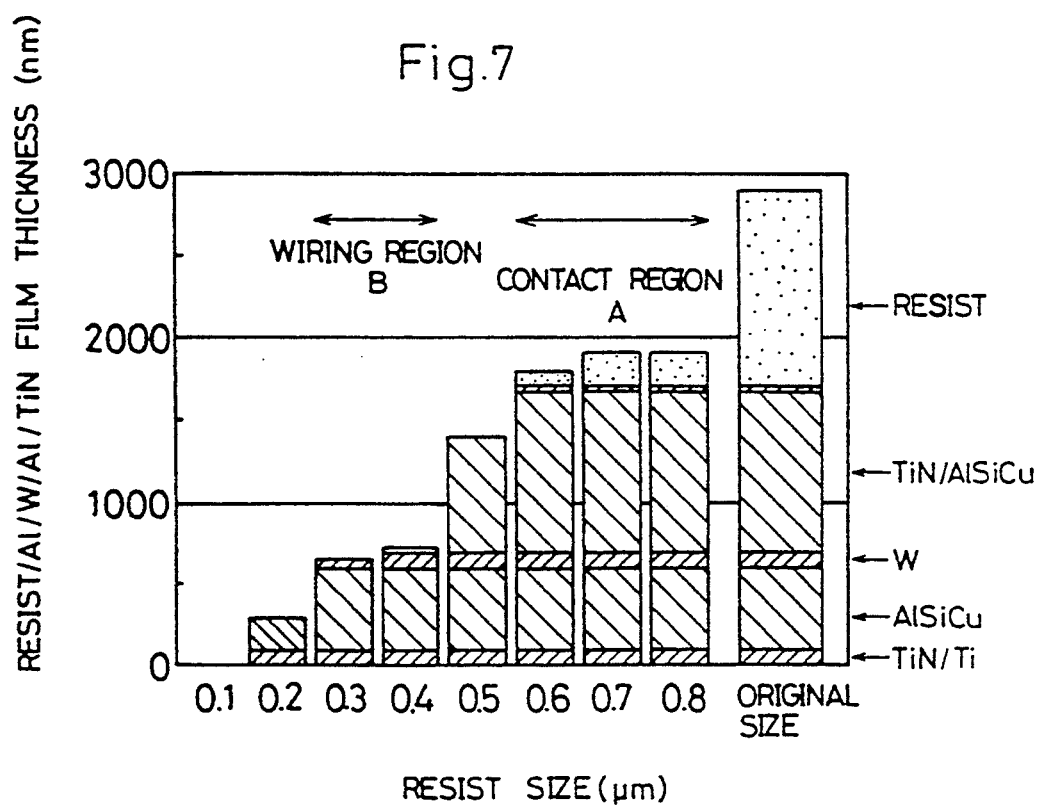
FIG. 7 is a graph showing film thicknesses of a metallic wiring, obtained after first to third etchings, with respect to various resist sizes in the third embodiment.

FIG. 7 is a graph showing film thicknesses of the metallic wiring, obtained after first to third etchings, with respect to various resist sizes. An original (initial) film thickness before etching is shown right in the graph of FIG. 7. From this experimental data, it is found that a contact region A with some resist thereon is obtained when the resist width is not less than 0.6 μm, meanwhile a wiring region B is obtained when the resist width is in a region of 0.3 to 0.4 μm. If the resist width is reduced less than 0.2 μm, no metallic wiring is obtained stably due to the limitations of photolithography. In the third embodiment, the widths of the contact region A and the wiring region B are designed to be 0.7 μm and 0.3 μm, respectively.

Figure 8:
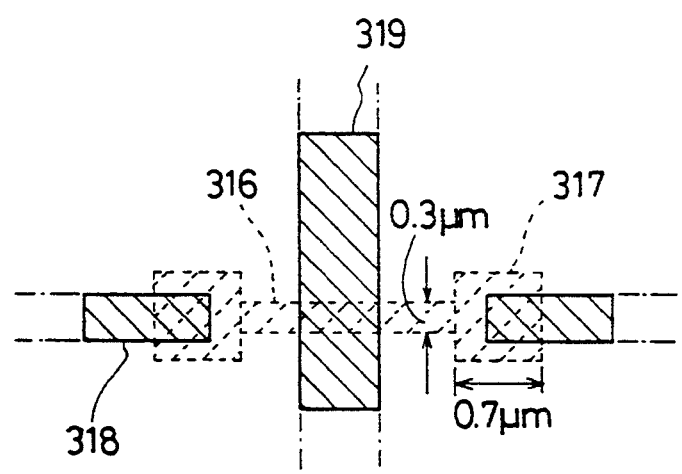
FIG. 8 is a plane view partly showing a test pattern of a through hole chain, which demonstrates the process of the third embodiment.

FIG. 8 is a plane view partly showing a test pattern (mask pattern) of a through hole chain, which demonstrates the process of the third embodiment. In FIG. 8, a dotted hatching region represents the first-layer pattern, while a solid hatching region represents the second-layer pattern. A wiring portion 316 of the first-layer metallic wiring is set to have a width of 0.3 μm, and a through hole portion 317 is set to have a width of 0.7 μm. (For reference, samples of 1.0 μm and 1.3 μm are also prepared) The second-layer metallic wiring is constituted by a wiring portion 318 and a short detecting portion 319.

Figure 9:
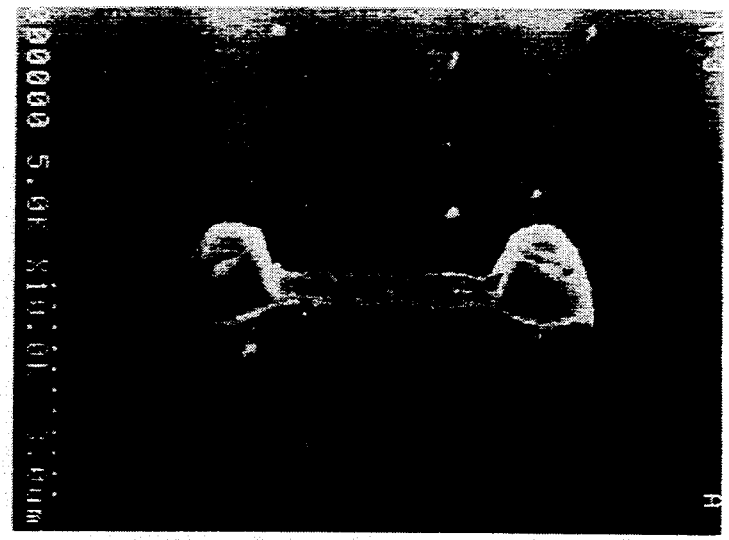
FIG. 9 is a microphotograph showing the first-layer pattern in accordance with the third embodiment.
Figure 10:
FIG. 10 is a microphotograph showing the second-layer pattern in accordance with the third embodiment.

FIG. 9 is a microphotograph showing the first-layer pattern (perspective view). FIG. 10 is a microphotograph showing the second-layer pattern (perspective view). As understood from the first-layer pattern shown in FIG. 9, the wiring portion 316 of the first-layer metallic wiring and the through hole portion 317 are etched to have heights different from each other. Furthermore, as understood from the second-layer pattern shown in FIG. 10, only the through hole portion 317 is connected with the wiring portion 318 of the second-layer metallic wiring.

Figure 11:
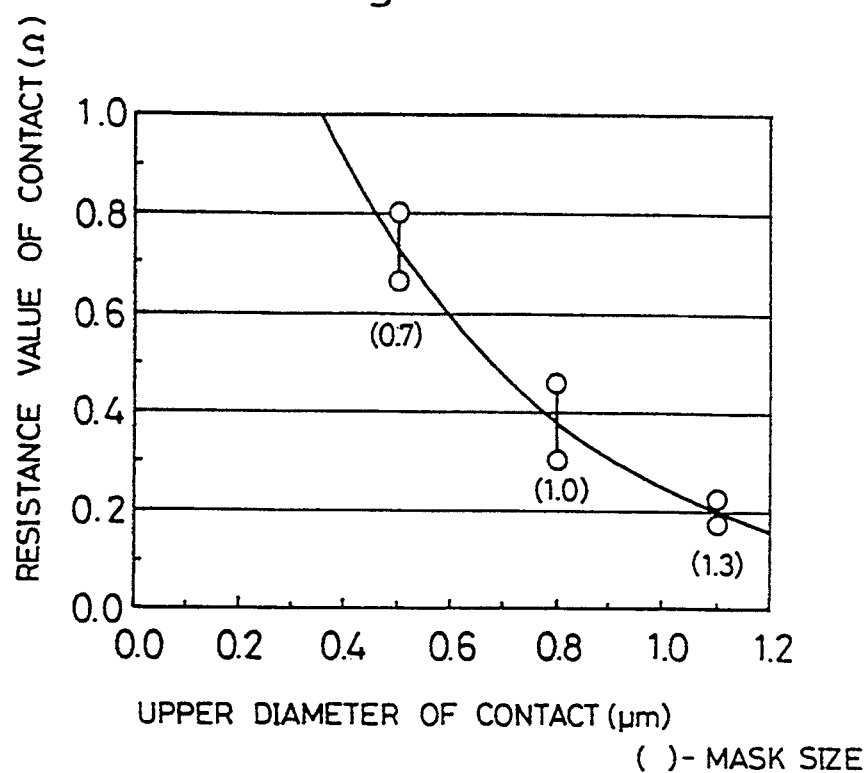
FIG. 11 is a graph showing a relationship between a resistance value of a contact and an upper diameter of the contact, measured on the test pattern of the through hole chain shown in FIG. 8.

FIG. 11 is a graph showing a relationship between a resistance value of a contact and an upper diameter of the contact, measured on the test pattern (mask pattern) of the through hole chain shown in FIG. 8. For the mask size of 0.7 μm, a resistance of approximately 0.7 Ω was obtained and connection of 80 chains was found.

Figure 12:
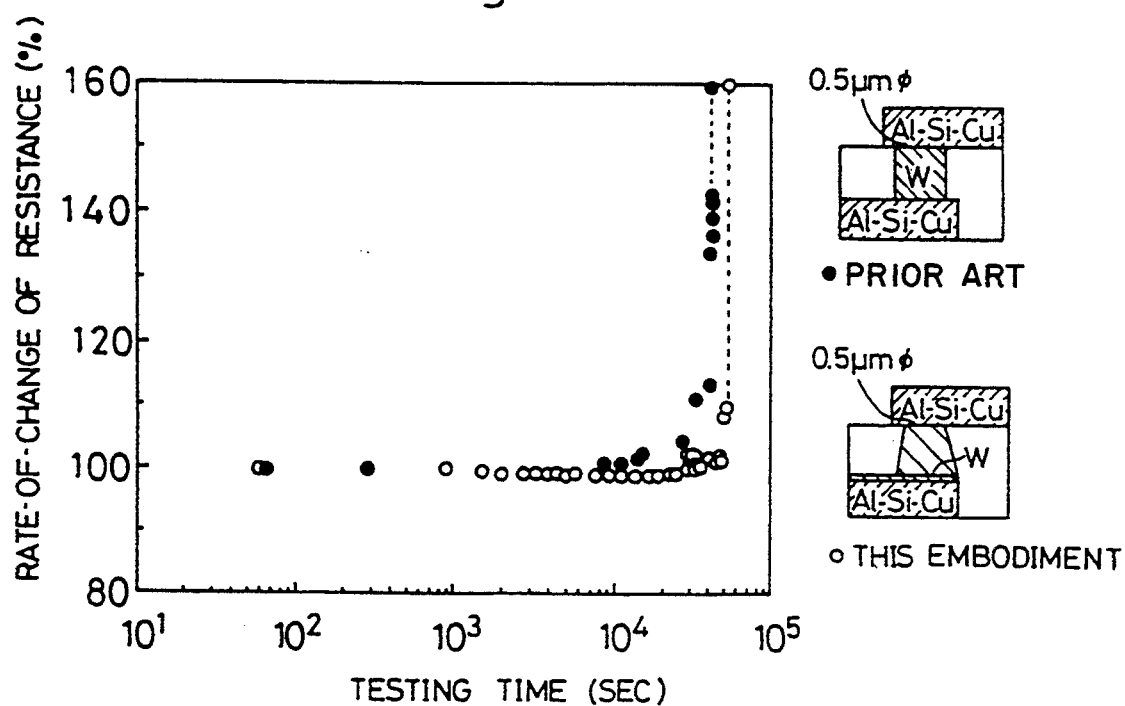
FIG. 12 is a graph showing a relationship between a rate-of-change of the chain and a current applied time based on a result of an electron migration test of the through hole chain shown in FIG. 8.

FIG. 12 is a graph showing a relationship between a rate-of-change of the chain resistance and a current applied time, based on a result of an electron migration test of the through hole chain shown in FIG. 8. The electron migration test is an acceleration test carried out under conditions of: temperature=200° C. and current value=15 mA at wafer level. For comparison, a test result of the prior art (the blanket W-CVD plugging technology) is shown based on a through hole with an upper diameter of 0.5 μmΦ. In FIG. 12, black round marks denote the result of the prior art, while white round marks denote the result of the present embodiment. From these data, it is found that the present embodiment and the prior art have substantially the same electron migration life with respect to the rate-of-change of resistance.

FIG. 13 is a table comparing the second and third embodiments. The third embodiment is different from the second embodiment in that the metallic film structure of the first-layer pattern is three-layer construction not the two-layer construction of the second embodiment. Although the third embodiment tends to increase the number of steps for accumulating metallic film layers, this third embodiment brings several merits, such as reduction of short resistance of the first-layer metallic wiring and reduction of resistance of the contact portion. Particularly, in the device design, this third embodiment is advantageous in that the sheet resistance can be lowered.

Fourth Embodiment

Hereinafter, the fourth embodiment of the present invention will be explained with reference to FIGS. 14A to 14E.

Figure 14A:
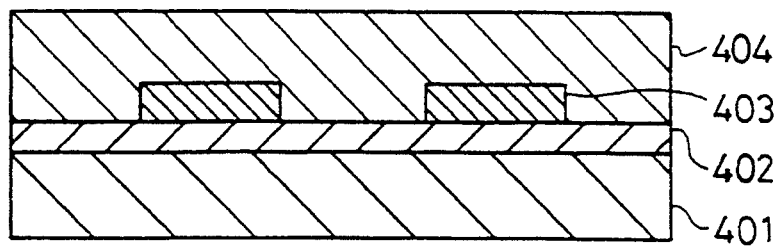
FIGS. 14A to 14E are cross-sectional views of a semiconductor device, illustrating a process for forming a multi-layer metallic wiring structure in accordance with the fourth embodiment of the present invention.

As illustrated in FIG. 14A, a BPSG film layer 402 with a film thickness of 700 nm, qualifying as a first insulating film layer, is accumulated on a silicon substrate 401. Then, a first-layer metallic wiring 403 is formed on this BPSG film layer 402 using lithography and dry etching. Thereafter, an inter-layer insulating film 404 with a film thickness of 2.5 μm, qualifying as a second insulating film, is accumulated on this first-layer metallic wiring 403. Then, the inter-layer insulating film layer 404 is flattened to have a film thickness of 2.0 μm using the CMP method or the resist etchback method.

Figure 14B:
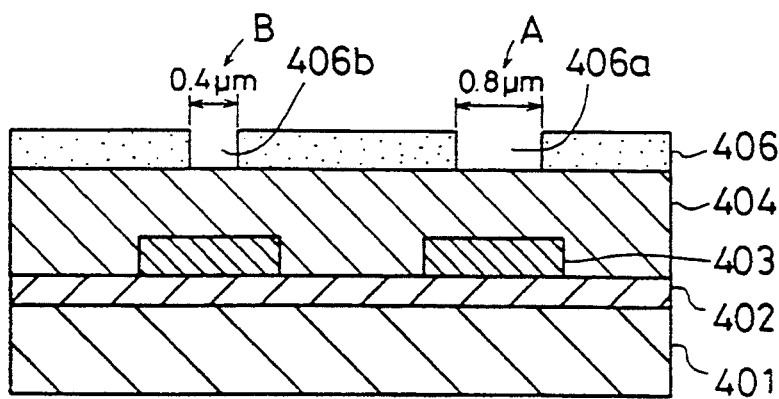

Next, as illustrated in FIG. 14B, there is formed on the inter-layer insulating film layer 404 a photo resist 406 having a wide-width opening 406a of 0.8 μm provided at a position corresponding to a contact region A for connecting the first-layer metallic wiring 403 and the second-layer metallic wiring and a narrow-width opening 406b of 0.4 μm provided at a position corresponding to a wiring region B for arranging the second-layer metallic wiring.

Figure 14C:
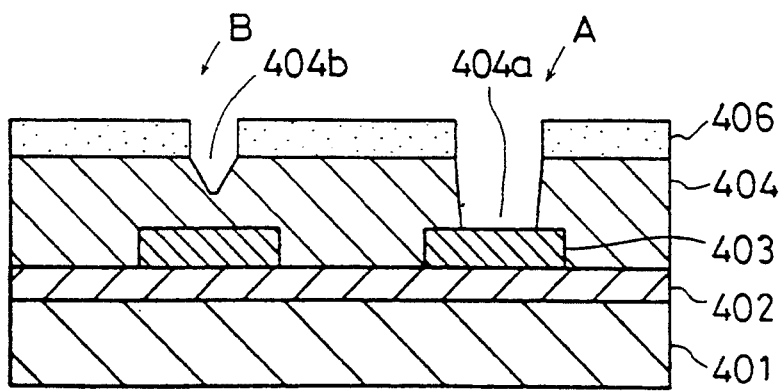

In turn, with this photo resist 406, an anisotropic CHF$_3$—CF$_4$—O$_2$ series dry etching is applied on the inter-layer insulating film layer 404. By optimizing the etching conditions, a shallow groove 404b is formed on the inter-layer insulating film layer 404 beneath the narrow-width opening 406b of the photo resist 406 without reaching the first-layer metallic wiring 403 while a deep hole 404a is formed on the inter-layer insulating film layer 404 beneath the wide-width opening 406a of the photo resist 406 so as to bare the first-layer metallic wiring 403, as shown in FIG. 14C. An etching phenomenon that etching amount increases with enlarging area of an opening is generally called the micro loading effect. The etching applied to the inter-layer insulating film layer 404 utilizes this micro loading effect.

Figure 14D:
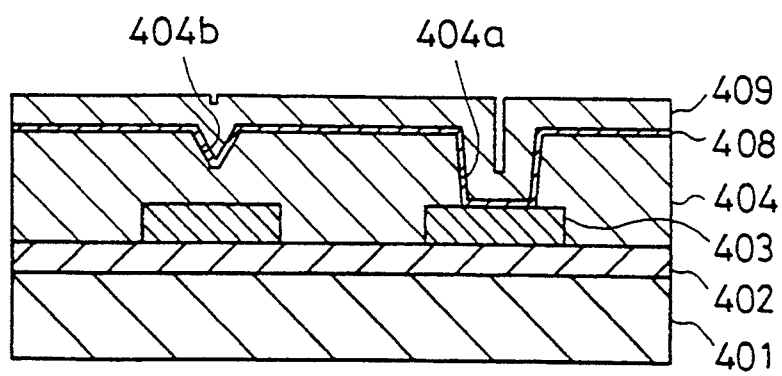

Subsequently, as illustrated in FIG. 14D, after removing the photo resist 406, a Ti series adhesion layer (Ti/Ti) 408 is accumulated on the inter-layer insulating film layer 404 by the sputter method. Then, a blanket W-CVD film layer 409 with a film thickness of 500 nm is accumulated on this Ti series adhesion layer 408.

Figure 14E:
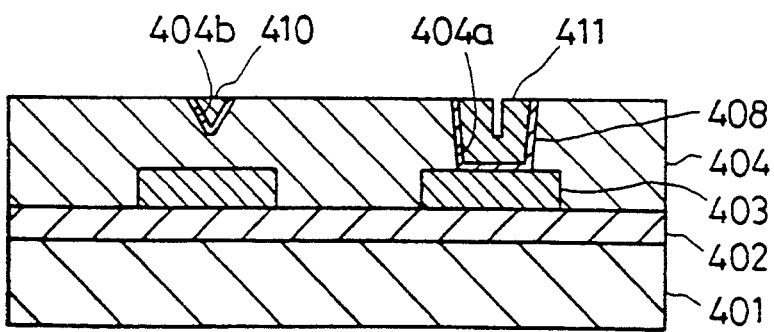

Next, as shown in FIG. 14E, an etchback is applied on the entire surfaces of the Ti series adhesion layer 408 and the blanket W-CVD film layer 409, thereby forming a wiring region of the second-layer metallic wiring 410 in the shallow groove 404b of the inter-layer insulating film layer 404, and also forming a contact 411 in the deep hole 404a of the inter-layer insulating film layer 404 for connecting the first-layer metallic wiring 403 and the second-layer metallic wiring 410.

Figure 15:
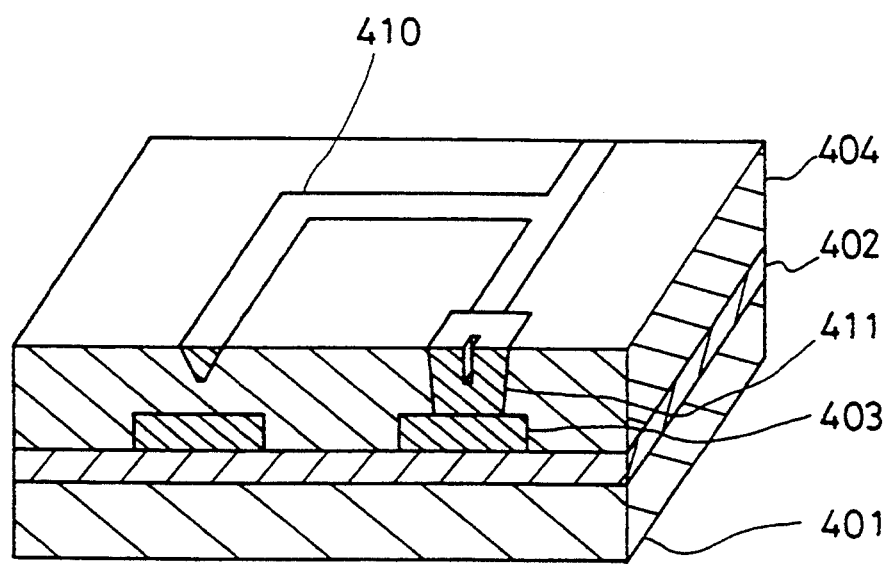
FIG. 15 is a perspective, cross-sectional view showing a semiconductor device obtained in accordance with the fourth embodiment of the present invention.

FIG. 15 is a perspective, cross-sectional view showing a semiconductor device obtained through the process of FIGS. 14A to 14E. From this drawing, it is found that the W-CVD film layer 409 remaining in the shallow groove 404b of the inter-layer insulating film layer 404 forms the second-layer metallic wiring 410 while the W-CVD film layer 409 remaining in the deep hole 404a of the inter-layer insulating film layer 404 forms the contact 411. The second-layer metallic wiring 410 is connected with the first-layer metallic wiring 403 through the contact 411, thus accomplishing the formation of a two-layer metallic wiring structure.

As explained above, this fourth embodiment is different from the first to third embodiments in that the mask for forming the second-layer metallic wiring is designed in such a manner that the wiring region and the contact region are discriminated from each other.

By the way, instead of the blanket W-CVD film 409, the metallic film for forming the second-layer metallic wiring 410 can be made of an aluminum metallic film using the high-temperature sputter method or other metallic film.

Fifth Embodiment

Hereinafter, the fifth embodiment of the present invention will be explained with reference to FIGS. 16A to 16G.

Figure 16A:
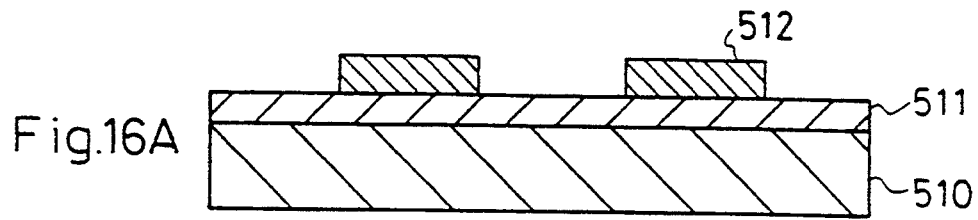
FIGS. 16A to 16G are cross-sectional views of a semiconductor device, illustrating a process for forming a multi-layer metallic wiring structure in accordance with the fifth embodiment of the present invention.

As illustrated in FIG. 16A, an $SiO_2$ film layer 511 with a film thickness of 700 nm, qualifying as a first insulating film, is accumulated on a silicon substrate 510. The $SiO_2$ film layer 511 is a thermal oxide film layer or a BPSG film layer. A first-layer metallic wiring 512 made of Al—Si—Cu is formed on this $SiO_2$ film layer 511 by photolithography and dry etching.

Figure 16B:
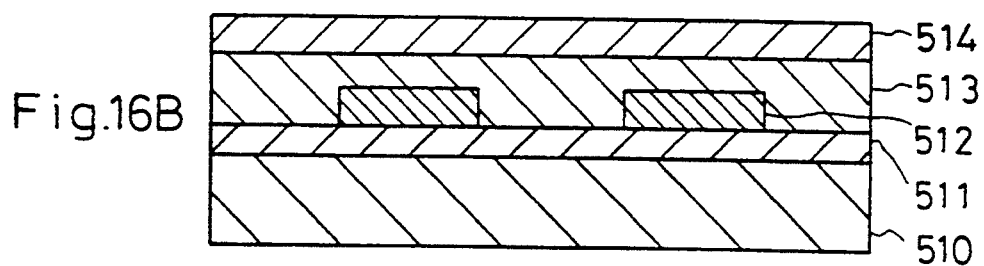

Next, as illustrated in FIG. 16B, an $SiO_2$ film layer 513, qualifying as an inter-layer insulating film layer of the first layer, is accumulated on the first-layer metallic wiring 512 and, then, the $SiO_2$ film layer 513 is flattened by an etchback using a flattening resist until the film thickness of the $SiO_2$ film layer 518 is reduced to 0.5 μm at the region above the first-layer metallic wiring 512. An SiN film layer 514 with a film thickness of 0.5 μm, qualifying as an inter-layer insulating film layer of the second layer, is accumulated on this flattened $SiO_2$ film layer 513. Thus, a two-layer, inter-layer insulating film structure is accomplished.

Figure 16C:
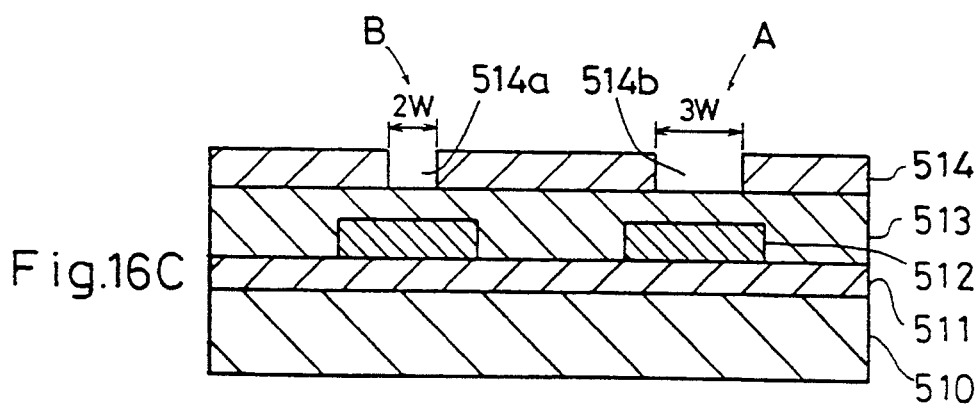

Subsequently, using photolithography and dry etching, a wide-width opening 514a is formed on the SiN film layer 514 at a position corresponding to a contact region A for connecting the first-layer metallic wiring 512 and a second-layer metallic wiring, while a narrow-width opening 514b is formed on the SiN film layer 514 at a position corresponding to a wiring region B of the second-layer metallic wiring, as shown in FIG. 16C. In this case, when the width of the narrow-width opening 514b is 2 w, where w is a constant and is selected to be 0.6 μm in this embodiment, the width of the wide-width opening 514a is 3 w. The above-described dry etching utilizes etching gas having selectivity to the $SiO_2$ film layer 513 to etch the SiN film layer 514 alone.

Figure 16D:
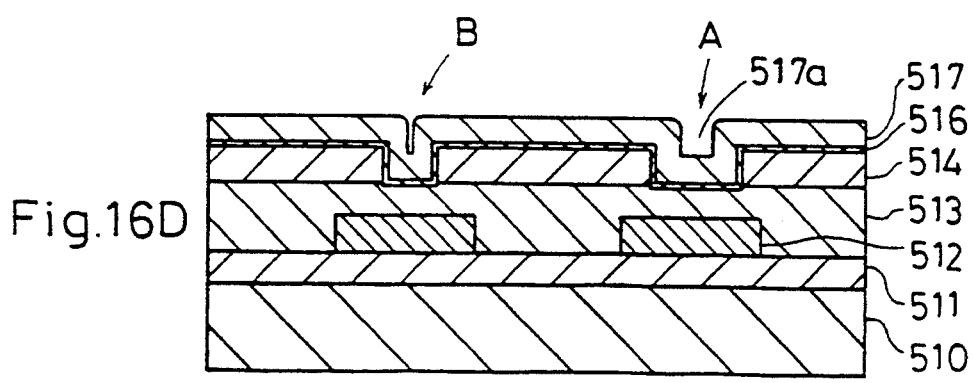

In turn, as illustrated in FIG. 16D, a first Ti series adhesion layer 516 is deposited on the SiN film layer 514 by the sputter method and, subsequently, a first W-CVD film layer 517 with a film thickness of 600 nm is accumulated on this first Ti series adhesion layer 516. The configuration at this moment is characterized in that the narrow-width opening 514b is completely plugged with the first W-CVD film layer 517 in the wiring region B of the second-layer metallic wiring while a recess 517a of the first W-CVD film layer 517 is formed in the contact region A. Thereafter, $SF_6$ series gas etching is applied on the entire surface of the W-CVD film layer 517. And then, Cl series gas etching is applied on the first Ti series adhesion layer 516, thereby baring the first-layer metallic wiring 512 in the contact region A.

Figure 16E:
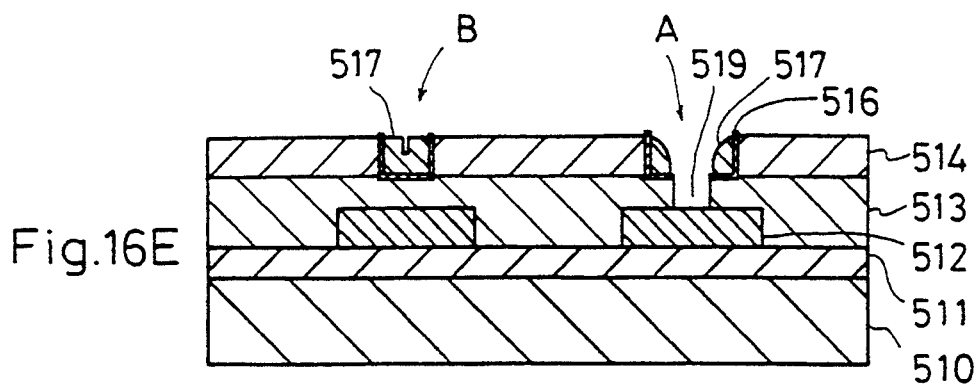

Next, the entire surface of the $SiO_2$ film layer 513 is etched under the etching conditions of high selective ratio to the SiN film layer 514, to form a through hole 519 in the contact region A as shown in FIG. 16E. With this through hole 519, the first-layer metallic wiring 512 is bared. On the other hand, the W-CVD film layer 517 remaining in the wiring region B serves as the second-layer metallic wiring.

Figure 16F:
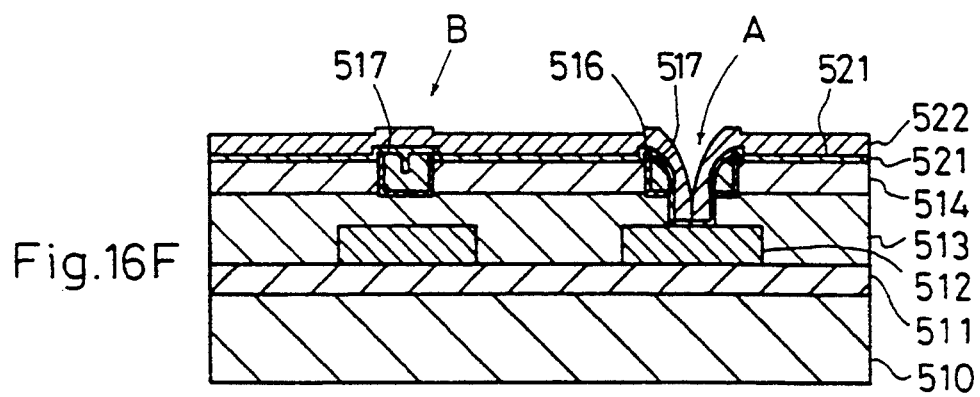

Subsequently, as illustrated in FIG. 16F, a second Ti series adhesion layer 521 is accumulated on the SiN film layer 514 and, then, a second W-CVD film layer 522 with a film thickness of 500 nm is accumulated on this second Ti series adhesion layer 521. Thus, the second W-CVD film layer 522 is connected with the first-layer metallic wiring 512 through the second Ti series adhesion layer 521 in the contact region A only.

Figure 16G:
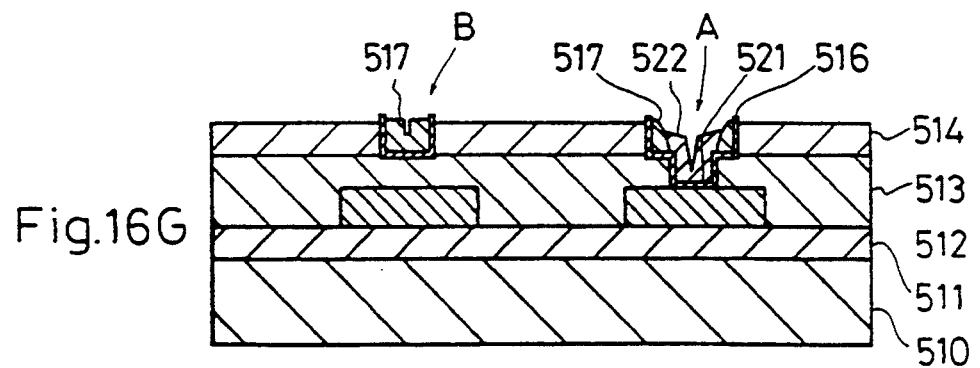

Next, as illustrated in FIG. 16G, etchback is applied on the entire surfaces of the second W-CVD film layer 522 and the second Ti series adhesion layer 521 in the same manner as in FIG. 16E, until the SiN film layer 514 is bared.

As explained in the foregoing description, a two-layer metallic wiring structure is accomplished through the process of FIGS. 16A to 16G. According to this two-layer metallic wiring structure, the wiring region B of the second-layer metallic wiring and the contact region A can be determined by the layout of the second-layer metallic wiring.

Figure 17A:
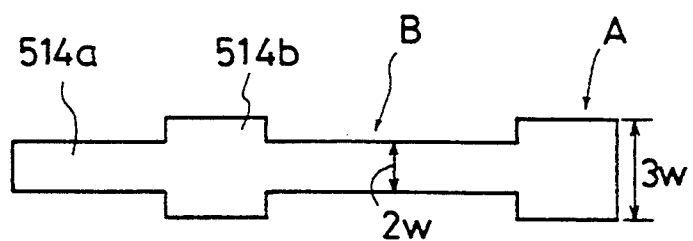
FIG. 17A is a plane view showing wide-width openings and narrow-width openings of an SiN film layer shown in FIG. 16C.

FIG. 17A is a plane view showing the wide-width openings 514a and the narrow-width openings 514a of the SiN film layer 514 shown in FIG. 16C. The wide-width opening 514a and the narrow-width opening 514b of the SiN film layer 514 show the layout of the second layer. The wiring region B of the second-layer metallic wiring is set to have a width of 2 w, while the contact region A of the second-layer metallic wiring is set to have a width of 3 w. By setting in this manner, the through hole reaching the first-layer metallic wiring is formed in the contact region A only.

Figure 17B:
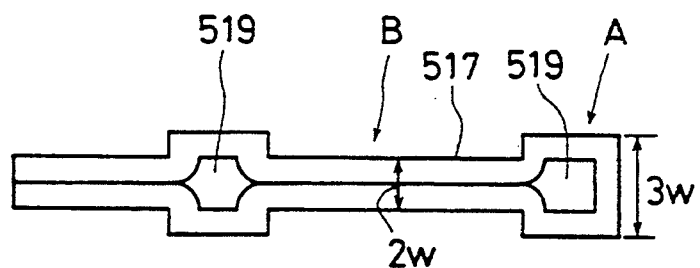
FIG. 17B is a plane view showing a first W-CVD film layer shown in FIG. 16E.
Figure 18A:
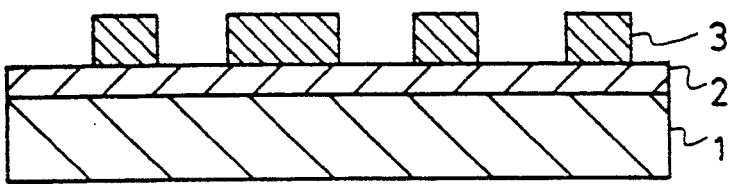
FIGS. 18A to 18C are cross-sectional views of a semiconductor device, illustrating a conventional process for forming a multi-layer metallic wiring structure.
Figure 18B:
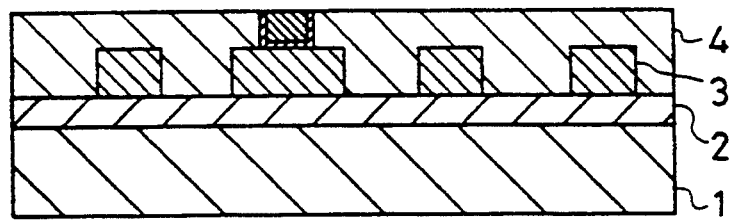
Figure 18C:
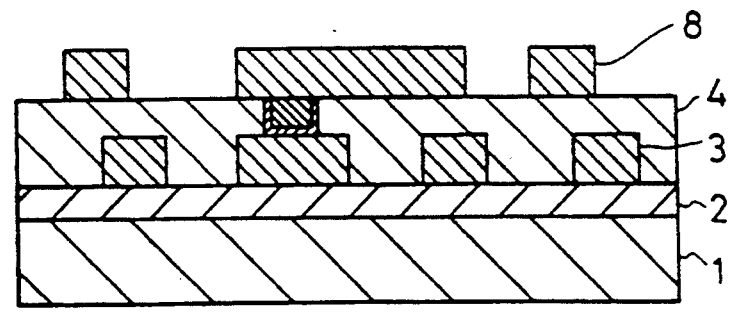

FIG. 17B is a plane view showing the first W-CVD film layer 517 shown in FIG. 16E. From this drawing, it is found that the through hole 519 is formed in the contact region A alone and the first W-CVD film layer 517 constitutes the wiring portion of the second-layer metallic wiring in the wiring region B.

Although above first to fifth embodiments are explained based on the two-layer metallic wiring structure, it is needless to say that the present invention can be applied to any other multi-layer metallic wiring structure having not less than three layers.

Furthermore, various materials, such as Al, W, Ti, Cu, Au, Mo and Poli-Si, can be adopted as the material to be used for metallic wiring, even if the fabrication method is the CVD method or the sputter method.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A method for forming a multi-layer metallic wiring structure comprising steps of:

accumulating a metallic film layer on a first insulating film layer formed on a semiconductor substrate;

forming a resist pattern with wide-width and narrow-width pattern portions on said metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring;

patterning said metallic film layer by applying etching on said metallic film layer with a mask of said resist pattern;

applying etching on said resist pattern and said metallic film layer to remove said resist pattern and to form both tall and short metallic film portions made of said metallic film layer, said tall metallic film portion being formed beneath said wide-width pattern portion of said resist pattern and said short metallic film portion being provided beneath said narrow-width pattern portion of said resist pattern;

accumulating a second insulating film layer, qualifying as an inter-layer insulating film layer, on said metallic film layer;

flattening said inter-layer insulating film layer so as to bare said tall metallic film portion without baring said short metallic film portion; and forming said second-layer metallic wiring on said second insulating film layer, so that said second-layer metallic wiring is connected with said tall metallic film portion.

2. A method for forming a multi-layer metallic wiring structure comprising steps of:

forming a first metallic film layer on a first insulating film layer formed on a semiconductor substrate;

forming a second metallic film layer on said first metallic film layer, said second metallic film layer being made of material different from that of said first metallic film layer;

forming a resist pattern with wide-width and narrow-width pattern portions on said second metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring;

patterning said second metallic film layer by applying etching on said second metallic film layer with a mask of said resist pattern;

applying etching on said first metallic film layer with masks of said resist pattern and said second metallic film layer, so as to leave only said wide-width pattern portion of said resist pattern and to pattern said first metallic film layer;

applying etching on said second metallic film layer with a mask of said wide-width pattern portion of said resist pattern, so as to form a contact beneath said wide-width pattern portion by only leaving said second metallic film layer in the region of said wide-width pattern portion of said resist pattern;

accumulating a second insulating film layer, qualifying as an inter-layer insulating film layer, on said contact and said first metallic film layer;

etching said second insulating film layer to bare said contact; and forming said second-layer metallic wiring on said second insulating film layer, so that said second-layer metallic wiring is connected with said contact.

3. A method for forming a multi-layer metallic wiring structure comprising steps of:

forming a first metallic film layer on a first insulating film layer formed on a semiconductor substrate;

forming a second metallic film layer on said first metallic film layer, said second metallic film layer being made of material different from that of said first metallic film layer;

forming a third metallic film layer on said second metallic film layer, said third metallic film layer being made of material different from that of said second metallic film layer;

forming a resist pattern with wide-width and narrow-width pattern portions on said third metallic film layer, said wide-width pattern portion being provided at a position corresponding to a contact for connecting a first-layer metallic wiring and a second-layer metallic wiring and said narrow-width pattern portion being provided at a position corresponding to a wiring portion for said first-layer metallic wiring;

patterning said third metallic film layer by applying first etching on said third metallic film layer with a mask of said resist pattern, and patterning said second metallic film layer by applying second etching on said second metallic film layer with a mask of said patterned third metallic layer, thereby leaving only said wide-width pattern portion of said resist pattern through said first and second etchings;

applying etching on said third metallic film layer with a mask of said wide-width pattern portion of said resist pattern, so as to form a contact beneath said wide-width pattern portion by only leaving said third metallic film layer in the region of said wide-width pattern portion of said resist pattern;

accumulating a second insulating film layer, qualifying as an inter-layer insulating film layer, on said contact and said second metallic film layer;

etching said second insulating film layer to bare said contact; and forming said second-layer metallic wiring on said second insulating film layer, so that said second-layer metallic wiring is connected with said contact.

4. A method for forming a multi-layer metallic wiring structure in accordance with claim 3, wherein said first metallic film layer and said third metallic film layer are made of the same material.

5. A method for forming a multi-layer metallic wiring structure in accordance with claim 4, wherein said first metallic film layer and said third metallic film layer are made of metal containing aluminum, while said second metallic film layer is made of metal containing tungsten.

6. A method for forming a multi-layer metallic wiring structure comprising steps of:

forming a first-layer metallic wiring on a first insulating film layer formed on a semiconductor substrate;

forming a flattened, second insulating film layer, qualifying as an inter-layer insulating film layer, on said first-layer metallic wiring;

forming a resist pattern with wide-width and narrow-width openings on said second insulating film layer, said wide-width opening being provided at a position corresponding to a contact for connecting said first-layer metallic wiring and a second-layer metallic wiring and said narrow-width opening being provided at a position corresponding to a wiring portion for said second-layer metallic wiring;

applying etching on said second insulating film layer with a mask of said resist pattern, in such a manner that a shallow groove is formed on said second insulating film layer beneath said narrow-width opening without baring said first-layer metallic wiring while a deep hole is formed on said second insulating film layer beneath said wide-width opening so as to bare said first-layer metallic wiring;

forming a metallic film layer on said second insulating film layer, so that said metallic film layer is connected with said first-layer metallic wiring in said wide-width opening of said resist pattern; and applying etchback on entire surfaces of said second insulating film layer and said metallic film layer to form said wiring portion of said second-layer metallic wiring in said shallow groove and said contact in said deep hole.

7. A method for forming a multi-layer metallic wiring structure comprising steps of:

forming a first-layer metallic wiring on a first insulating film layer formed on a semiconductor substrate;

forming a flattened, second insulating film layer, qualifying as an inter-layer insulating film layer, on said first-layer metallic wiring;

forming wide-width and narrow-width openings on said second insulating film layer respectively having a depth not reaching said first-layer metallic wiring, said wide-width opening being provided at a position corresponding to a contact for connecting said first-layer metallic wiring and a second-layer metallic wiring and said narrow-width opening being provided at a position corresponding to a wiring portion for said second-layer metallic wiring;

forming a first metallic film layer on said second insulating film layer;

applying etchback on entire surface of said first metallic film layer to bare said second insulating film layer;

baring said first-layer metallic wiring by etching said second insulating film layer in the region beneath said wide-width opening;

forming a second metallic film layer on said second insulating film layer so that said second metallic film layer is connected to said first-layer metallic wiring; and applying etchback on entire surface of said second metallic film layer until said second insulating film layer is bared, thereby forming said second-layer metallic wiring made of said second metallic film layer.

* * * * *